United States Patent
Ehwald et al.

(10) Patent No.: US 6,627,972 B1
(45) Date of Patent: Sep. 30, 2003

(54) VERTICAL BIPOLAR TRANSISTOR

(75) Inventors: Karl-Ernst Ehwald, Frankfurt (DE); Dieter Knoll, Frankfurt (DE); Bernd Heinemann, Frankfurt (DE)

(73) Assignee: Institut fuer Halbleiterphysik Frankfurt (Oder) GmbH, Frankfurt (DE)

(*) Notice: Subject to any disclaimer, the term of this patent is extended or adjusted under 35 U.S.C. 154(b) by 0 days.

(21) Appl. No.: 09/786,653

(22) PCT Filed: Sep. 8, 1999

(86) PCT No.: PCT/DE99/02884
§ 371 (c)(1),
(2), (4) Date: Mar. 7, 2001

(87) PCT Pub. No.: WO00/14806
PCT Pub. Date: Mar. 16, 2000

(30) Foreign Application Priority Data

Sep. 8, 1998 (DE) .......................... 198 42 106

(51) Int. Cl.⁷ ............................................. H01L 31/108
(52) U.S. Cl. .................... 257/586; 257/592; 257/593
(58) Field of Search ................... 438/320, 341, 438/348; 148/DIG. 59; 257/197, 198, 592, 593, 586

(56) References Cited

U.S. PATENT DOCUMENTS 4,737,472 A   4/1988  Schaber
4,967,253 A * 10/1990  Jambotkar (List continued on next page.)

FOREIGN PATENT DOCUMENTS

| DE | 39 40 674 A1 | 6/1990 |
| DE | 42 11 050 C2 | 10/1995 |
| DE | 196 50 493 A1 | 6/1997 |
| EP | 0 227 970 B1 | 8/1990 |
| EP | 0 418 421 A1 | 3/1991 |
| EP | 0 550 962 A2 | 7/1993 |
| EP | 0 709 894 A1 | 5/1996 |
| EP | 0 767 499 A2 | 4/1997 |
| EP | 0 778 615 A1 | 6/1997 |
| EP | 0 786 816 A2 | 7/1997 |
| WO | WO 97/24756 A1 | 7/1997 |
| WO | WO 97/24757 A1 | 7/1997 |
| WO | WO 97/36328 A1 | 10/1997 |

OTHER PUBLICATIONS

Lu, Pong–Fei, "The Design and Optimization of High Performance, Double–Poly Self–Aligned p–n–p Technology," IEEE Transactions on Electron Devices, vol. 38 (No. 6), p. 1410–18, (Jun. 20, 1991).

Nakamura, "Recent Progress in Bi–Polar Transistor Technology," IEEE Transactions on Electron Devices, vol. 42 (No. 3), p. 390–8, (Mar. 20, 1995).

Primary Examiner—Long Pham
(74) Attorney, Agent, or Firm—Hahn Loeser + Parks LLP; Stephen L. Grant

(57) ABSTRACT

The invention relates to a vertical bipolar transistor and a method for the production thereof. The aim of the invention is to produce a vertical bipolar transistor and to disclose a method for the production thereof, whereby excellent high frequency properties can be obtained for said transistor using the simplest possible production technology involving an implanted epitaxy-free collector and only one polysilicon layer spread over a large surface and which can be easily integrated into a conventional mainstream CMOS process without epitaxially produced trough areas. It is possible to simplify technology, while at the same time improving the high frequency parameters of vertical bipolar transistors by reducing the parasitic lateral and vertical components of the resistance of the collector, by means of a self-adjusting transistor construction in conjunction with a special method of production, whereby a highly doped monocyrstalline base connection area surrounding the active base in a ring-like manner is removed in the region of the collector connection by reactive ion etching, together with the underlying less doped area of the collector or a part thereof.

5 Claims, 3 Drawing Sheets

U.S. PATENT DOCUMENTS

| | | | |
|---|---|---|---|
| 5,064,772 A | * | 11/1991 | Jambotkar |
| 5,073,508 A | * | 12/1991 | Villalon |
| 5,087,580 A | | 2/1992 | Eklund |
| 5,124,270 A | * | 6/1992 | Morizuka |
| 5,198,689 A | * | 3/1993 | Fujioka |
| 5,296,733 A | * | 3/1994 | Kusano et al. |
| 5,346,840 A | * | 9/1994 | Fujioka |
| 5,358,882 A | | 10/1994 | Bertagnolli |
| 5,402,002 A | | 3/1995 | Meister |
| 5,424,227 A | * | 6/1995 | Dietrich et al. |
| 5,484,737 A | * | 1/1996 | Ryum et al. |
| 5,530,273 A | | 6/1996 | Nakamura |
| 5,604,374 A | | 2/1997 | Inou |
| 5,663,097 A | | 9/1997 | Sakamoto |
| 5,696,007 A | | 12/1997 | Ryum |
| 6,423,990 B1 | * | 7/2002 | El-Sharawy et al. |

* cited by examiner

VERTICAL BIPOLAR TRANSISTOR

This invention concerns a vertical bi-polar transistor and a procedure for its manufacture.

BACKGROUND OF THE ART

The collector resistance, which has a decisive influence on the high-frequency properties of bi-polar transistors, usually has a non-negligible parasitic lateral component in the conventional transistor designs.

This occurs because the conventional designs of vertical bi-polar transistors use a collector terminal that is laterally separated from the base zone of the active (inner) transistor by field oxide, and a base zone that usually completely surrounds the emitter in order to keep the base resistance low, which is also important for the high-frequency properties of the transistor. With a given minimum lateral expansion of the base zone important for achieving a minimal base resistance, which is determined by the existing design rules for the mask procedures, the minimum distance between the collector and the inner transistor is set and it complies at least with the minimum dimensions determined by the structure-building process.

The size of the parasitic lateral component of the collector resistance is influenced, besides the lateral dimensions of the field oxide zone, also by the layer resistance of the sub-collector. The sub-collector consists of a highly doped semi-conductor zone, which is separated, in vertical direction, from the base zone of the active transistor by a significantly less doped collector layer mostly produced by epitaxy. A reduction of the layer resistance under the already reached and practically used level may not be technically possible. However, on the contrary it is desirable to achieve very good high-frequency properties also with relatively easy-to-build "retrogressively" implanted collector profiles, for the manufacture of which is used neither an epitaxy layer nor a collector manufactured separately, and which, therefore, are connected with a relatively high collector resistance. Although there exist well-known solutions such as EP 227 970 B1 how to achieve useful collector resistance and good high-frequency properties with such implanted retrogressive collector profiles, these solutions have the disadvantage of a costly manufacturing process with at least two mutually overlapping polysilicon levels for the base and the emitter. This is why the desired cost-reducing simplification of the manufacturing process is not achieved or is achieved only partially with the aforementioned well-known solutions.

The task of this invention is to propose a vertical bi-polar transistor and a procedure for its manufacture, while achieving excellent high-frequency properties of the transistor with a manufacturing technology as simple as possible that requires an implanted epitaxy -free collector and only one extensively deposited polysilicon level, and is easily integrated in a conventional mainstream CMOS process without tub zones produced by epitaxy.

SUMMARY OF THE INVENTION

According to this invention, a simplification of the manufacturing technology with a simultaneous improvement of the high-frequency parameters of vertical bi-polar transistors through a reduction of parasitic lateral and vertical collector resistance components is achieved by means of a self-adjusting transistor design in connection with a special manufacturing procedure, during which a highly doped monocrystal base zone surrounding the active base is removed in the area of the collector by ion etching together with the underlying less doped zone of the collector or a part thereof. This enables a self-positioning of the deeper lying collector terminal to the base zone, which allows to reduce to a functionally required minimum the distance between the silicated collector terminal and the equally silicated monocrystal base zone by means of a spacer conventionally manufactured from an insulating material during the etching process. The elimination of the less doped collector zone avoids the necessity of the so-called collector shaft implantation, and the vertical component of the collector terminal resistance is equally reduced. Before the self-positioning, preferably joint siliconization of the base and the collector zone according to this invention, only a flat high-dose implantation is required such as the manufacture of flat S/D zones usual in modem MOS technology. Only narrow edge areas of the base and collector zones (covered with a spacer made of insulating material or with an emitter overlapping the base zone) are exempt from the siliconization. The thus produced collector—which is self-positioned to the base zone—usually surrounds the inner transistor on three sides so that the lateral component of the collector resistance is further minimized in the sense of the task of this invention. If the bi-polar transistor manufactured according to this invention is integrated in a CMOS process, the siliconization of the base and collector terminal may be purposefully performed together with the siliconization of the S/D and gate zones.

In an especially advantageous design form of the invention, the base zone comprises a second outer sub-zone, which consists of a metal silicide on a highly doped polycrystal layer of the same material and is of the same doping type as the inner monocrystal sub-zone. This outer sub-zone is separated from the collector or from the monocrystal semiconductor substrate by a thick insulation layer, and therefore has, as compared with the first subzone, a very tiny capacity to the collector or the monocrystal semi-conductor substrate.

In another especially advantageous design form of the invention, the collector and sub-collector of npn bi-polar transistors are a part of a retrogressive doped profile manufactured by P ion implantation in a semi-conductor substrate. The doped profile can be also used as a domain for MOS transistors integrated on the same substrate. Although the subcollector of the thus manufactured bi-polar transistor has a many times higher layer resistance as compared with the conventional transistor designs with an epitaxial collector and a highly doped buried subcollector layer, the collector resistance is comparable with the resistance of standard designs with epitaxy and a buried subcollector.

The inner base and the monocrystal sub-zone of the base zone preferably consist of epitaxially deposited silicon or silicon-germanium. Designs with an implanted base zone are, however, also possible within this invention, and the invention, as described here, can also be used with conventional bi-polar substrates with a subcollector of low-impedance and an epitaxial collector to further reduce the collector resistance as compared with the known standard designs and thus e.g. to increase the cutoff frequency $f_1$ and the maximum oscillation frequency $f_{max}$ beyond the values so far achieved by the standard designs.

This design can be technologically realized in an especially advantageous manner by first producing a subcollector, a collector, a basis and an insulation layer covering them in a continuous active zone, which will later also contain the subsequent collector terminal, and then introduce emitter windows in the insulating layer.

Subsequently, an emitter is deposited, which overlaps the emitter windows and preferably consists of highly doped polysilicon. Afterwards, and preferably self-adjusting to the polysilicon of the emitter, the base zone surrounding the emitter is highly doped (as compared to the inner base), and subsequently completely removed in the area of the subsequent collector terminal by means of a suitable anisotropic etching procedure, together with at least a part of the weakly doped collector. During this etching procedure, the inner base including the emitter that covers it and the subsequent base zone are protected by a coating or hard mask. A self-adjusting spacer from insulating material, which was produced on the almost vertical stage arising during the etching, prevents the creation of silicide on the wall of this stage during the ensuing salicide process with the formation of salicide on the deeper lying collector terminal and preferably also simultaneously in the base zone.

If an epitaxial base is used, at least a part of the polycrystal layer, which forms the outer sub-zone, is simultaneously deposited during the epitaxial depositing of the first subzone of the base zone. The self-positioning implantation of a highly doped semi-conductor zone under the metal silicide of the collector terminal is made possible in another advantageous procedure variant by an auxiliary mask, which is impervious to the aforementioned implantation and which is used during a reactive ion etching process applied to the base and to the weakly doped collector zone, and further made possible by a spacer produced on the etching edges after the etching of the weakly doped collector zone.

Other advantageous procedure forms are described in the corresponding sub-claims and in the design example.

BRIEF DESCRIPTION OF THE DRAWINGS

In addition to the claims, the characteristics of the invention also follow from the description and the drawings, while the individual characteristics on its own or in the form of a sub-combination represent patentable observations, for which patent protection is sought here. A design example according to this invention is illustrated in the drawings and is explained in detail in the following text, and the drawings show:

DETAILED DESCRIPTION OF THE INVENTION

Figure 3:
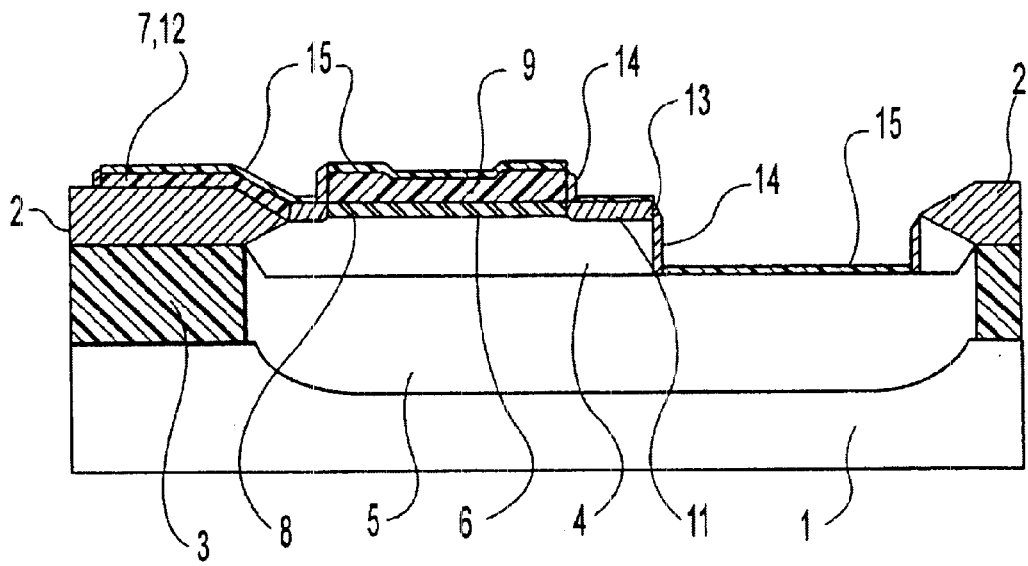
FIG. 3 shows a stage of manufacture subsequent to FIG. 2 of a method according to the present invention.
Figure 4:
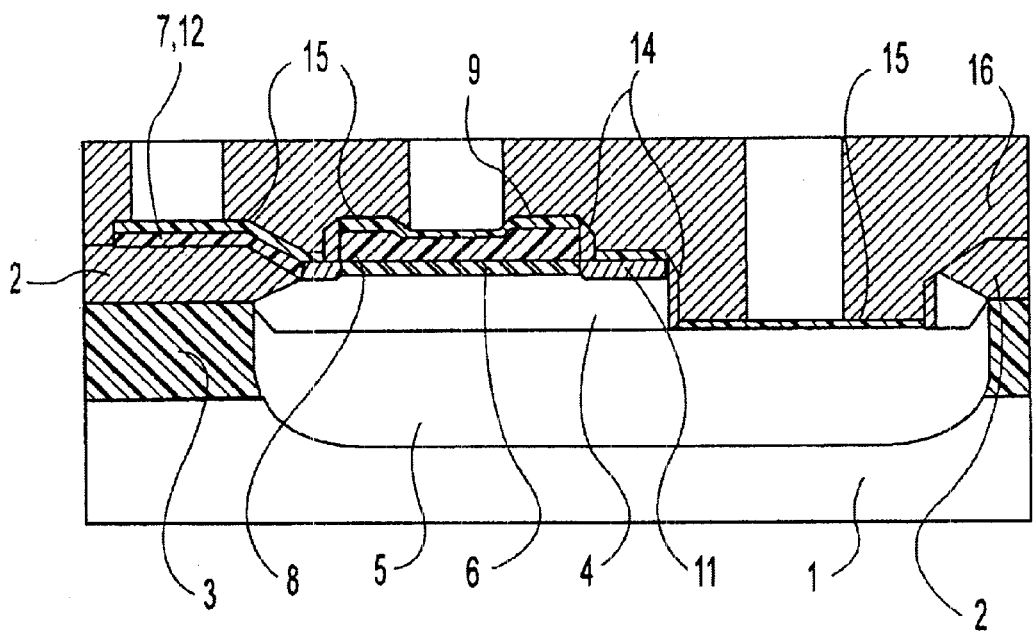
FIG. 4 shows a stage of manufacture subsequent to FIG. 3 of a method according to the present invention.
Figure 5:
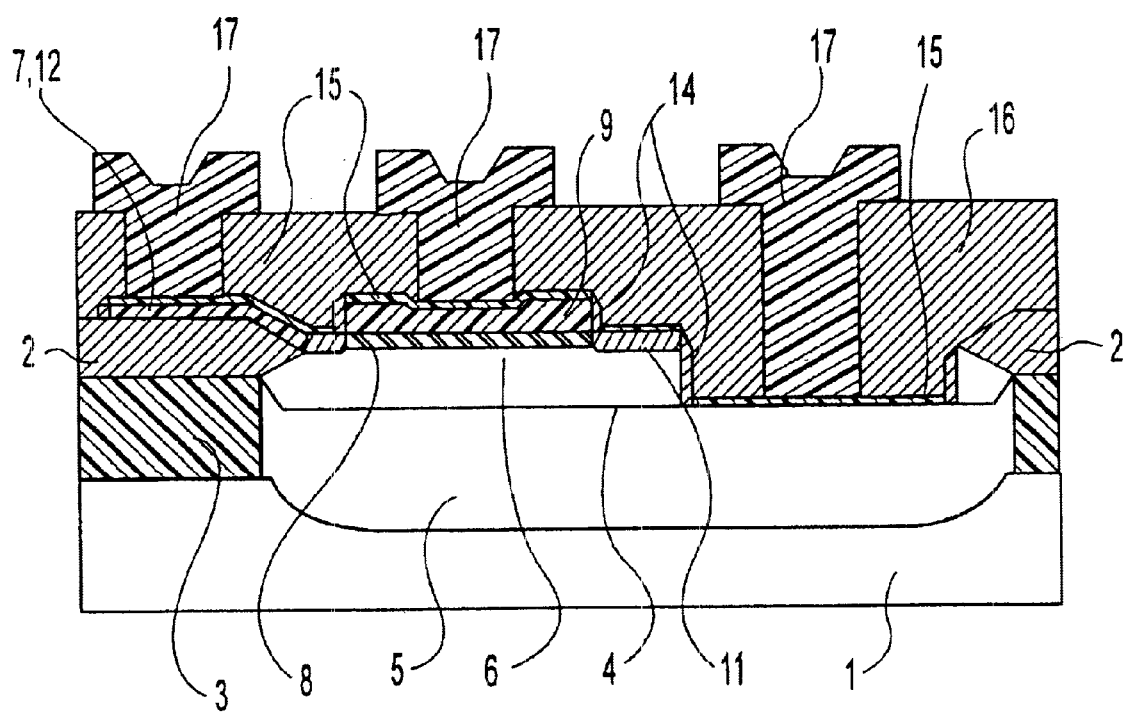
FIG. 5 shows as a final stage of manufacture a vertical npn hetero-junction bipolar transistor.
Figure 1:
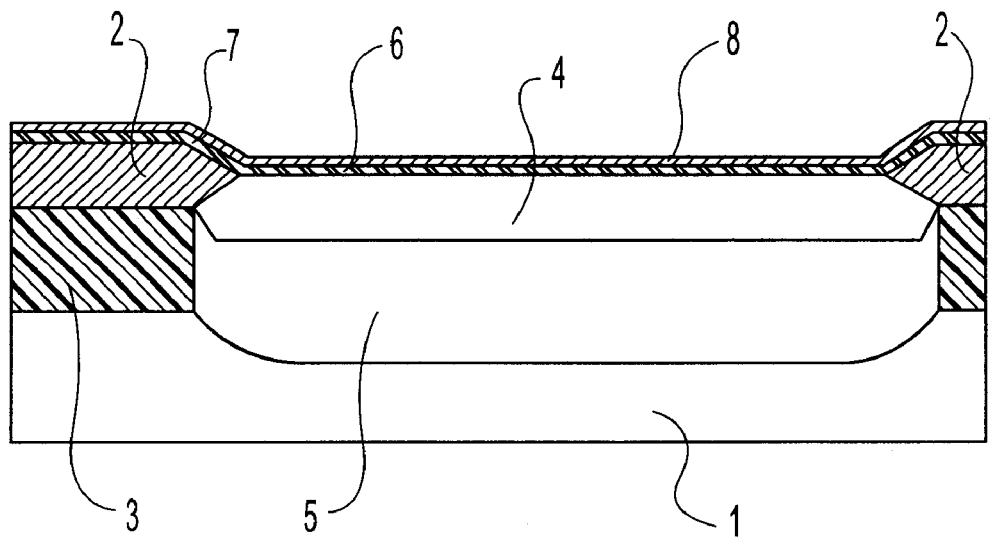
Figure 2:
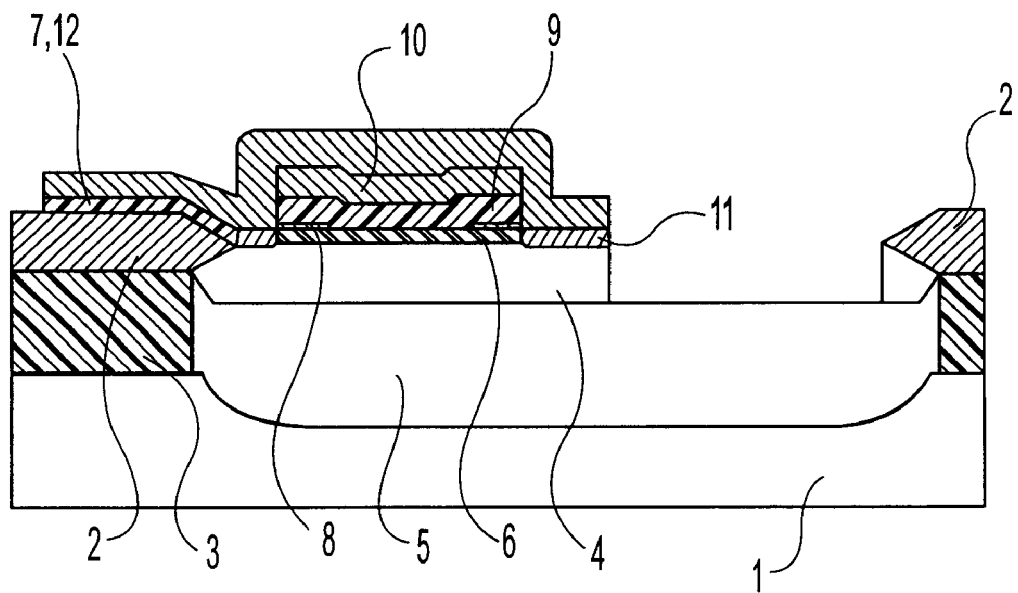
Figure 3:
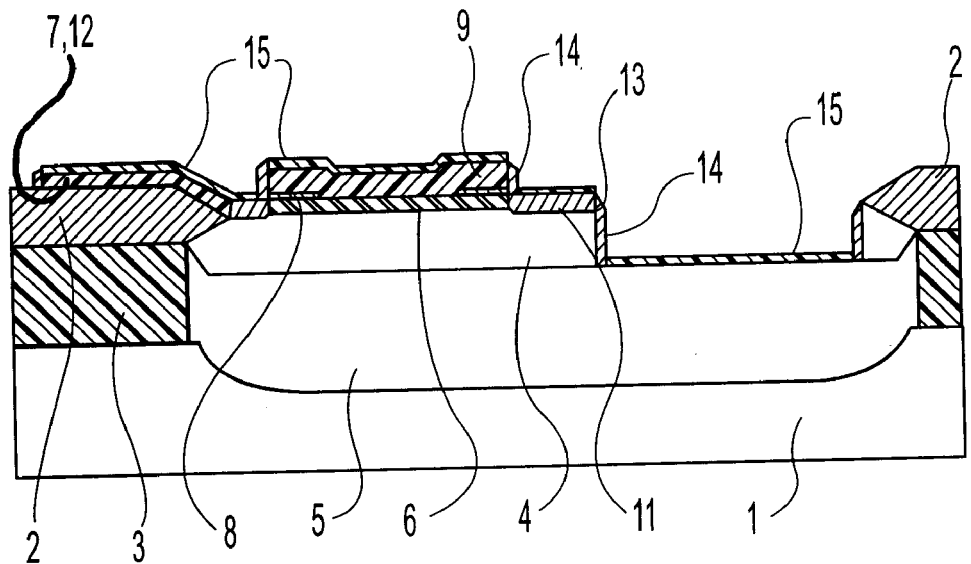
Figure 4:
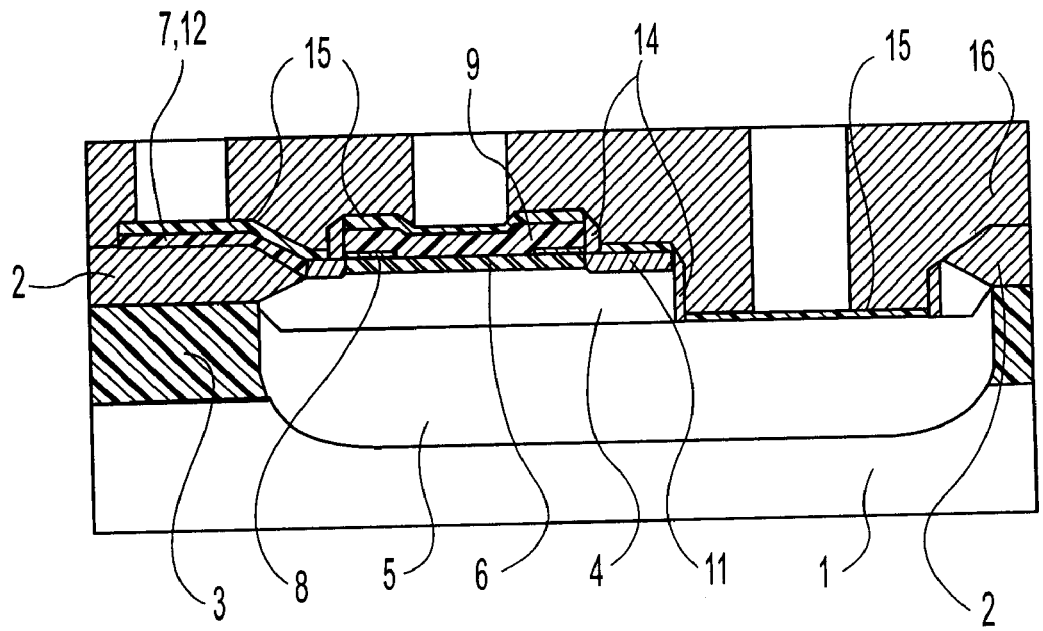
Figure 5:
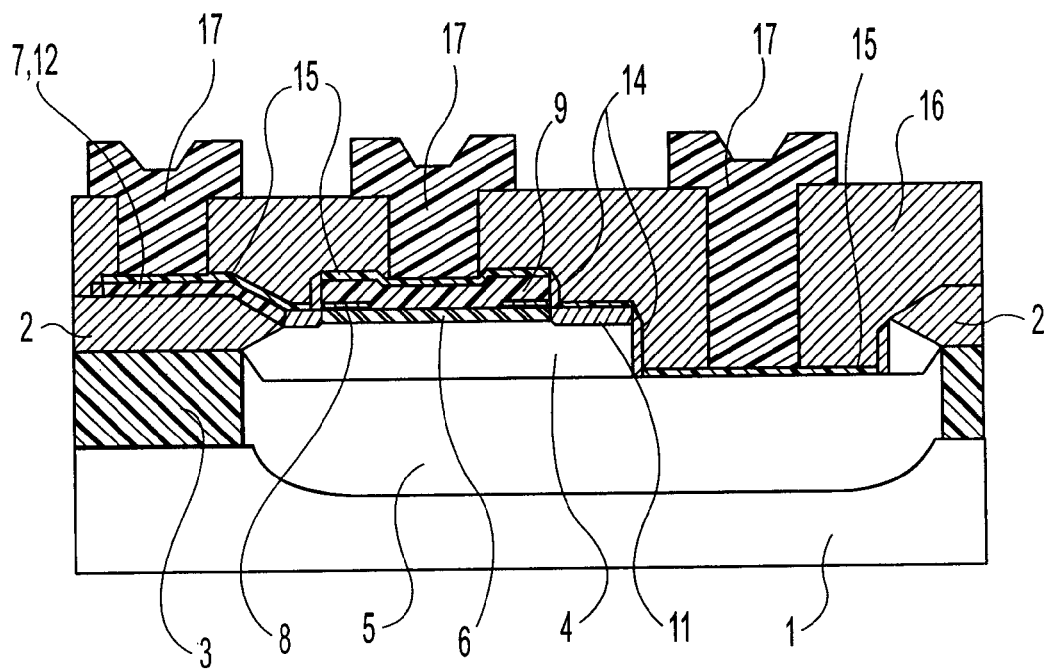

FIG. 5 shows a schematic design of a vertical npn silicon/silicon-germanium hetero-junction bi-polar transistor with an implanted collector, an epitaxial base and a self-positioning collector connection to the base zone. FIGS. 1 to 4 clarify various stages of the manufacturing process.

The example is based on a conventionally manufactured basic structure in a pconductive silicon substrate 1. The substrate contains field oxide zones 2 produced by LOCOS oxidation, with silicon zones 3 arranged underneath, which are of the same conductivity type as the substrate but have a higher doping level.

Figure 1:
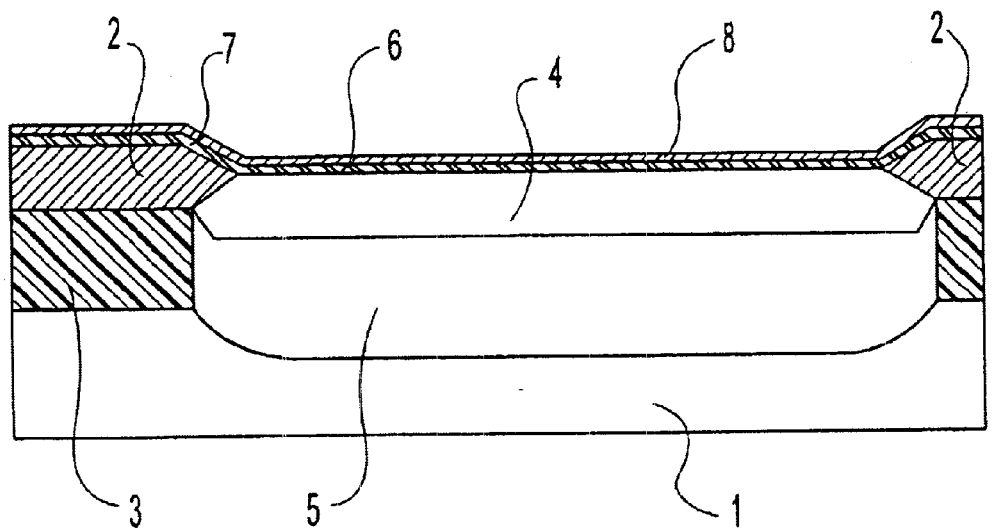
FIG. 1 is an initial stage of a method according to the present invention showing a substrate with a layer structure prepared for the manufacture of a vertical npn heterojunction bipolar transistor.
Figure 2:
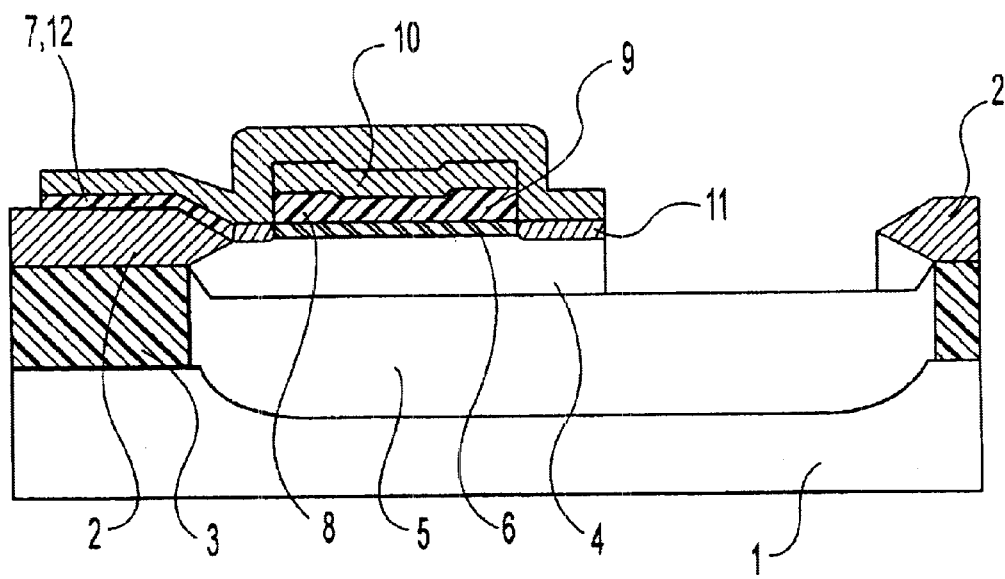
FIG. 2 shows a stage of manufacture subsequent to FIG. 1 of a method according to the present invention.

Into this basic structure a doping profile is introduced, preferably by implanting phosphorus ions, a profile in which the concentration of implanted doping atoms grows starting from the surface until it reaches its maximum deep in the material (retrogressive doping profile), and which forms the subcollector zones 5 and the collector zones 4. With a suitably selected implantation energy and design of the field oxide zones 2 and silicon zones 3, the implantation does not require a separate masking, which guarantees that the collector zones 4 and the subcollector zones 5 arise in the entire area between the silicon zones 3, which form the outer limits of the transistor. After a healing-up process of the implantation damage and a suitable cleaning of the exposed active silicon zones, a base layer 6 is deposited containing a silicongermanium layer with a high boron doping, which is implanted during the epitaxy process. The epitaxy process is controlled in such a manner that a polycrystal layer 7 grows simultaneously on the field oxide zones 2. Polycrystal layer 7 has a thickness comparable with the epitaxial silicon-germnanium layer 6, and laterally adjoins to this layer without interruption (FIG. 1). After depositing, the $SiO_2$ layer 8 is removed—by means of usual photo-engraving and etching technologies—from the zones that form the inner transistor. After the coating mask has been removed and the surface properly cleaned, an in-situ arsenic-doped polysilicon layer 9 and a $Si_3N_4$ layer 10 are deposited. Afterwards, the polysilicon layer 9 and the $Si_3N_4$ layer 10 are removed down the zones of the later-to-be-produced polysilicon emitter with the etching process to stop at the $SiO_2$ layer 8, doing so by means of a second mask, which completely covers (with a pre-defined overlapping) the windows etched in the $Sio_2$ layer 8, and using an anisotropic ion etching process. After removal of the mask, the exposed zones of the base layer are implanted—in a self-adjusting manner to the emitter covered with $Si_3N_4$,—with a high dose of $BF_2$ ions. The thus arising highly doped silicon-germanium layers (of monocrystal nature in the area of the collector zones 5, and of polycrystal nature in the area of the field oxide zone 2) are covered with another $Si_3N_4$ layer and subsequently structured by means of a third coating mask in such a manner that only the inner and outer sub-zones 11 and 12 of the base zones remain. Using the good etching stop of the reactive ion etching process, and after removing the epitaxial silicon-germanium layer 6, the etching process is continued in the field oxide zones 2 in the collector zones 4 until the weakly doped part of the collector over the subcollector zones 5 is removed (FIG. 2). After the third coating mask has been removed, an $Si_3N_4$ spacer on the vertical etched edges 13 is completely etched away with known technical means, and an $SiO_2$ spacer 14 is produced on the steep edges of the emitter and the collector zone. Afterwards, the surface of zones 5, 11, 12 and 9 is cleared of oxide residue and is transformed into a $TiSi_3$ layer 15, while no silicide arises on the oxide spacers 14 during this self-positioning process (salicide process) so that the insulation between these zones is guaranteed (FIG. 3). In the subsequent process, a thick $SiO_2$ layer 16 is deposited over the described transistor design in a conventional manner, the layer is planarized, equipped with contact windows and the base, the emitter and the collector are connected with aluminum channels 17 (FIGS. 4 and 5).

The described transistor design can be integrated in a CMOS process without difficulties, during which the siliconization of the source/drain and gate zones can be effectively connected with the siliconization of the emitter, collector and the base zones.

The present invention has explained, by means of a concrete design example, a vertical bi-polar transistor and a procedure for its manufacture. However, it must be noted that the present invention is not restricted to the described details of the design example, since patent claims are laid also on any modifications and alterations.

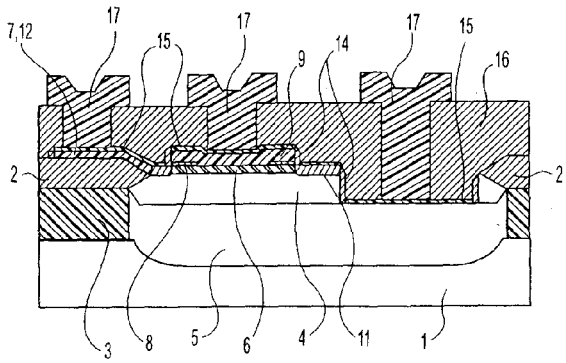

What is claimed is:

1. A vertical bi-polar transistor with an emitter and a collector, said transistor comprising:

a collector terminal; and a base connection zone;

at least one inner sub-zone of the base connection zone being designed in the form of a narrow layer combination surrounding the emitter in a ring-like formation, the inner subzone consisting of a highly doped monocrystalline semi-conductor zone and an overlaying highly conductive metal silicide that covers and has contact with the entire highly doped monocrystalline semi-conductor zone with the exception of very narrow peripheral areas that are located under insulating spacers, which serve for peripheral termination of the highly doped monocrystal semi-conductor zone;

an outer sub-zone of the base connection zone, consisting of a metal silicide on a highly doped polycrystalline layer of the same material and of the same doping type as a corresponding monocrystalline sub-layer of the inner sub-zone of the base connection zone, and which is separated from the collector or an underlying monocrystalline semiconductor substrate by a thick insulation layer, and which has a low capacity to the collector or the substrate as compared with the inner sub-zone of the base zone; and wherein the inner monocrystalline sub-zone of the base connection zone is adjacent, on three sides thereof, to the collector terminal, and wherein the collector terminal is equally covered and in contact with a highly conductive metal silicide on its entire surface with the exception of narrow peripheral areas covered with a spacer.

2. The vertical bi-polar transistor according to claim 1, wherein an inner base and the monocrystalline inner sub-zone of the base connection zone are made of deposited Si or SiGe.

3. A vertical bi-polar transistor with a collector terminal self-positioned to a base connection zone, comprising:

at least one inner sub-zone of the base connection zone which is designed in the form of a narrow layer combination surrounding the emitter in a ring-like formation, and consisting of a highly doped monocyrstalline semiconductor zone and an overlaying highly conductive metal silicide, wherein the metal silicide covers and has contact with the entire highly doped monocyrstalline semiconductor zone with the exception of very narrow peripheral areas, which are located under insulating spacers, which serve for peripheral termination of the highly doped monocyrstalline semiconductor zone; and an outer sub-zone of the base connection zone, which consists of a metal silicide on a highly doped polycrystalline layer of the same material and of the same doping type as a corresponding monocyrstalline sub-layer of the inner sub-zone of the base connection zone, and which is separated form the collector or an underlying monocyrstalline semiconductor substrate by a thick insulation layer, and which has a very low capacity to the collector or the substrate as compared with the inner sub-zone of the base zone, wherein the inner monocyrstalline sub-zone of the base connection zone is adjacent, on at least one side, to a collector terminal, and wherein the collector is equally covered and in contact with a highly conductive metal silicide on its entire surface with the exception of narrow peripheral areas covered with a spacer, and wherein an inner base and the monocyrstalline inner sub-zone of the base connection zone are made of deposited Si or SiGe.

4. The vertical bi-polar transistor according to claim 1, wherein the collector connection lies deeper than the inner sub-zone of the base connection zone.

5. The vertical bi-polar transistor according to claim 1, wherein the three sides of the inner monocrystalline sub-zone adjacent to the collector connection are of approximately the same length.

* * * * *

UNITED STATES PATENT AND TRADEMARK OFFICE
CERTIFICATE OF CORRECTION

PATENT NO. : 6,627,972 B1
DATED : September 30, 2003
INVENTOR(S) : Ehwald et al.

It is certified that error appears in the above-identified patent and that said Letters Patent is hereby corrected as shown below:

Delete Title page illustrating figure, and substitute therefor new Title page illustrating figure (attached)

Delete drawing sheets 1-3, and substitute therefor drawing sheets 1-3, as shown on the attached sheet.

Signed and Sealed this

Tenth Day of August, 2004

JON W. DUDAS
*Acting Director of the United States Patent and Trademark Office*

(12) United States Patent
Ehwald et al.

(10) Patent No.: US 6,627,972 B1
(45) Date of Patent: Sep. 30, 2003

(54) VERTICAL BIPOLAR TRANSISTOR

(75) Inventors: Karl-Ernst Ehwald, Frankfurt (DE); Dieter Knoll, Frankfurt (DE); Bernd Heinemann, Frankfurt (DE)

(73) Assignee: Institut fuer Halbleiterphysik Frankfurt (Oder) GmbH, Frankfurt (DE)

( * ) Notice: Subject to any disclaimer, the term of this patent is extended or adjusted under 35 U.S.C. 154(b) by 0 days.

(21) Appl. No.: 09/786,653
(22) PCT Filed: Sep. 8, 1999
(86) PCT No.: PCT/DE99/02884
§ 371 (c)(1), (2), (4) Date: Mar. 7, 2001
(87) PCT Pub. No.: WO00/14806
PCT Pub. Date: Mar. 16, 2000

(30) Foreign Application Priority Data

Sep. 8, 1998 (DE) .......................... 198 42 106

(51) Int. Cl.[7] ............................. H01L 31/108
(52) U.S. Cl. .................. 257/586; 257/592; 257/593
(58) Field of Search .................. 438/320, 341, 438/348; 148/DIG. 59; 257/197, 198, 592, 593, 586

(56) References Cited

U.S. PATENT DOCUMENTS

| 4,737,472 A | 4/1988 | Schaber |
| 4,967,253 A | * 10/1990 | Jambotkar |

(List continued on next page.)

FOREIGN PATENT DOCUMENTS

| DE | 39 40 674 A1 | 6/1990 |
| DE | 42 11 050 C2 | 10/1995 |
| DE | 196 50 493 A1 | 6/1997 |
| EP | 0 227 970 B1 | 8/1990 |
| EP | 0 418 421 A1 | 3/1991 |
| EP | 0 550 962 A2 | 7/1993 |
| EP | 0 709 894 A1 | 5/1996 |
| EP | 0 767 499 A2 | 4/1997 |
| EP | 0 778 615 A1 | 6/1997 |
| EP | 0 786 816 A2 | 7/1997 |
| WO | WO 97/24756 A1 | 7/1997 |
| WO | WO 97/24757 A1 | 7/1997 |
| WO | WO 97/36328 A1 | 10/1997 |

OTHER PUBLICATIONS

Lu, Pong–Fei, "The Design and Optimization of High Performance, Double–Poly Self–Aligned p–n–p Technology," IEEE Transactions on Electron Devices, vol. 38 (No. 6), p. 1410–18, (Jun. 20, 1991).

Nakamura, "Recent Progress in Bi–Polar Transistor Technology," IEEE Transactions on Electron Devices, vol. 42 (No. 3), p. 390–8, (Mar. 20, 1995).

Primary Examiner—Long Pham
(74) Attorney, Agent, or Firm—Hahn Loeser + Parks LLP; Stephen L. Grant

(57) ABSTRACT

The invention relates to a vertical bipolar transistor and a method for the production thereof. The aim of the invention is to produce a vertical bipolar transistor and to disclose a method for the production thereof, whereby excellent high frequency properties can be obtained for said transistor using the simplest possible production technology involving an implanted epitaxy-free collector and only one polysilicon layer spread over a large surface and which can be easily integrated into a conventional mainstream CMOS process without epitaxially produced trough areas. It is possible to simplify technology, while at the same time improving the high frequency parameters of vertical bipolar transistors by reducing the parasitic lateral and vertical components of the resistance of the collector, by means of a self-adjusting transistor construction in conjunction with a special method of production, whereby a highly doped monocyrstalline base connection area surrounding the active base in a ring-like manner is removed in the region of the collector connection by reactive ion etching, together with the underlying less doped area of the collector or a part thereof.

5 Claims, 3 Drawing Sheets